(12) United States Patent
Liu et al.

(10) Patent No.: US 9,142,649 B2
(45) Date of Patent: Sep. 22, 2015

(54) SEMICONDUCTOR STRUCTURE WITH METAL GATE AND METHOD OF FABRICATING THE SAME

(75) Inventors: An-Chi Liu, Tainan (TW); Chun-Hsien Lin, Tainan (TW)

(73) Assignee: UNITED MICROELECTRONICS CORP., Science-Based Industrial Park, Hsin-Chu (TW)

(*) Notice: Subject to any disclaimer, the term of this patent is extended or adjusted under 35 U.S.C. 154(b) by 59 days.

(21) Appl. No.: 13/454,036

(22) Filed: Apr. 23, 2012

(65) Prior Publication Data

US 2013/0277686 A1  Oct. 24, 2013

(51) Int. Cl.
*H01L 27/088* (2006.01)
*H01L 29/66* (2006.01)
*H01L 29/78* (2006.01)
*H01L 29/165* (2006.01)
*H01L 29/49* (2006.01)
*H01L 29/51* (2006.01)

(52) U.S. Cl.
CPC ........ *H01L 29/66795* (2013.01); *H01L 29/165* (2013.01); *H01L 29/6653* (2013.01); *H01L 29/6659* (2013.01); *H01L 29/66545* (2013.01); *H01L 29/66628* (2013.01); *H01L 29/66636* (2013.01); *H01L 29/785* (2013.01); *H01L 29/7834* (2013.01); *H01L 29/7848* (2013.01); *H01L 29/4966* (2013.01); *H01L 29/517* (2013.01); *H01L 29/665* (2013.01)

(58) Field of Classification Search
CPC .................. H01L 21/823864; H01L 27/0924; H01L 27/088; H01L 27/092; H01L 27/10826; H01L 27/10879; H01L 21/76; H01L 1/76224; H01L 21/8238–21/82364; H01L 29/161; H01L 29/772; H01L 29/7848; H01L 29/7853
USPC .......................... 257/288, 347, 371, 374, 377
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,855,607 B2 | 2/2005 | Achuthan | |
| 6,921,963 B2 | 7/2005 | Krivokapic | |
| 7,013,446 B2 | 3/2006 | Ohba | |
| 7,087,477 B2 | 8/2006 | Fried | |
| 7,091,551 B1 | 8/2006 | Anderson | |
| 7,112,495 B2 | 9/2006 | Ko | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,521,324 B2 | 4/2009 | Ohmi | |
| 7,531,437 B2 | 5/2009 | Brask | |
| 7,569,857 B2 | 8/2009 | Simon | |
| 7,592,270 B2 | 9/2009 | Teo | |
| 7,687,364 B2 * | 3/2010 | Sell | 438/303 |
| 2003/0222319 A1 | 12/2003 | Azuma | |

(Continued)

*Primary Examiner* — Julia Slutsker
*Assistant Examiner* — Natalia Gondarenko
(74) *Attorney, Agent, or Firm* — Winston Hsu; Scott Margo (57) ABSTRACT

A metal gate process comprises the steps of providing a substrate, forming a dummy gate on said substrate, forming dummy spacers on at least one of the surrounding sidewalls of said dummy gate, forming a source and a drain respectively in said substrate at both sides of said dummy gate, performing a replacement metal gate process to replace said dummy gate with a metal gate, removing said dummy spacers, and forming low-K spacers to replace said dummy spacers.

6 Claims, 9 Drawing Sheets

(56) References Cited

U.S. PATENT DOCUMENTS

| | | |
|---|---|---|
| 2004/0195624 A1 | 10/2004 | Liu |
| 2005/0051825 A1 | 3/2005 | Fujiwara |
| 2005/0186746 A1* | 8/2005 | Lee et al. ............... 438/300 |
| 2006/0099830 A1 | 5/2006 | Walther |
| 2006/0286729 A1 | 12/2006 | Kavalieros |
| 2007/0015365 A1 | 1/2007 | Chen |
| 2007/0072376 A1 | 3/2007 | Chen |
| 2007/0096148 A1* | 5/2007 | Hoentschel et al. ...... 257/192 |
| 2007/0108528 A1 | 5/2007 | Anderson |
| 2007/0134878 A1 | 6/2007 | Brask et al. |
| 2007/0158756 A1 | 7/2007 | Dreeskornfeld |
| 2007/0218661 A1 | 9/2007 | Shroff |
| 2008/0061366 A1 | 3/2008 | Liu |
| 2008/0081406 A1* | 4/2008 | Choo et al. ............... 438/199 |
| 2008/0157208 A1 | 7/2008 | Fischer |
| 2008/0197426 A1* | 8/2008 | Okazaki ................... 257/411 |
| 2009/0057759 A1 | 3/2009 | Obradovic |
| 2009/0124097 A1 | 5/2009 | Cheng |
| 2009/0200494 A1 | 8/2009 | Hatem |
| 2009/0242964 A1 | 10/2009 | Akil |
| 2009/0269916 A1 | 10/2009 | Kang |
| 2010/0044783 A1 | 2/2010 | Chuang |
| 2010/0048027 A1 | 2/2010 | Cheng |
| 2010/0072553 A1 | 3/2010 | Xu |
| 2010/0129994 A1 | 5/2010 | Awad |
| 2010/0144121 A1 | 6/2010 | Chang |
| 2010/0167506 A1 | 7/2010 | Lin |
| 2010/0219480 A1* | 9/2010 | Tezuka et al. ............ 257/369 |
| 2011/0156154 A1* | 6/2011 | Hoentschel et al. ...... 257/369 |
| 2011/0193175 A1* | 8/2011 | Huang et al. ............. 257/386 |
| 2013/0285155 A1* | 10/2013 | Glass et al. .............. 257/369 |

* cited by examiner

SEMICONDUCTOR STRUCTURE WITH METAL GATE AND METHOD OF FABRICATING THE SAME

BACKGROUND OF THE INVENTION

1. Field of the Invention

The present invention relates generally to a semiconductor structure and a method of fabricating the same. In particular, the present invention relates to a semiconductor structure with metal gate and low-K spacer and a method of fabricating the same.

2. Description of the Prior Art

In recent years, as various kinds of consumer electronic products have continuously improved and been miniaturized, the size of semiconductor components has reduced accordingly, in order to meet requirements of high integration, high performance, and low power consumption.

With the trend in the industry being towards scaling down the size of the metal oxide semiconductor transistors (MOS), three-dimensional or non-planar transistor technology, such as fin field effect transistor technology (Fin FET) has been developed to replace planar MOS transistors. The three-dimensional structure of a fin FET increases the overlapping area between the gate and the fin structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In conventional processes for fabricating fin FET devices, the sidewalls of the gate and fin structures are covered with a spacer. The material of said spacer tends to remain on the sidewalls of the fin structure, and the poor gap filling capacity makes it hard to fill the recess or the trench structure during the formation of said spacer. Furthermore, with the trend in the industry being towards scaling down the size of semiconductor devices, the distance between gate and source/drain becomes even smaller, thereby inducing parasitic capacitances. This may impact the electrical properties of the semiconductor devices.

Accordingly, the present invention is directed to improve the structure and process of conventional semiconductor devices, in order to further enhance the performance of the devices.

SUMMARY OF THE INVENTION

To overcome the above-mentioned drawbacks of the prior art, a new semiconductor structure and a method for fabricating the same is provided. The electrical properties of gate devices formed by this method are further improved by using the spacers made of low-K material to replace the preformed dummy spacer.

One objective of the present invention is to provide a metal gate process, comprising the steps of providing a substrate, forming a dummy gate on said substrate, forming a dummy spacer on at least one of the surrounding sidewalls of said dummy gate, forming a source and a drain respectively in said substrate at both sides of said dummy gate, performing a replacement metal gate process to replace said dummy gate with a metal gate; removing said dummy spacer, and forming a low-K spacer to replace said dummy spacer.

Another object of the present invention is to provide a fin field effect transistor (Fin FET) process comprising the step of providing a substrate, forming at least one fin structure on said substrates, forming a dummy gate on parts of said fin structure, forming a dummy spacer on at least one of the surrounding sidewalls of said dummy gate, forming a source and a drain respectively in said fin structure at both sides of said dummy gate, performing a replacement metal gate process to replace said dummy gate with a metal gate, removing said dummy spacer, and forming a low-K spacer to replace said dummy spacer.

Still another object of the present invention is to provide a semiconductor structure with a metal gate comprising a substrate, a metal gate on said substrate, epitaxial structures disposed respectively at both sides of said metal gate, and low-K spacers disposed respectively in the recesses between said metal gate and said epitaxial structures, wherein the top surface of said low-K spacer is lower than the top surface of said metal gate.

Still another object of the present invention is to provide a fin field effect transistor comprising a substrate, at least one fin structure formed on said substrate, a gate formed on said fin structure, epitaxial structures formed respectively in said fin structure at both sides of said gate, and low-K spacers formed respectively in the recesses between said gate and said epitaxial structures and in the recesses surrounding said fin structures, wherein said low-K spacer is leveled with the top surface of said epitaxial structure and lower than the top surface of said gate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The embodiments will now be explained with reference to the accompanying drawings to provide a better understanding of the process of the present invention, wherein FIGS. 1-8 are cross-sectional views illustrating the process flow of a metal gate forming method in accordance with the first preferred embodiment of the present invention; FIGS. 9-15 are cross-sectional views illustrating the process flow of a fin field effect transistor (Fin FET) forming method in accordance with the second preferred embodiment of the present invention.

Figure 1:
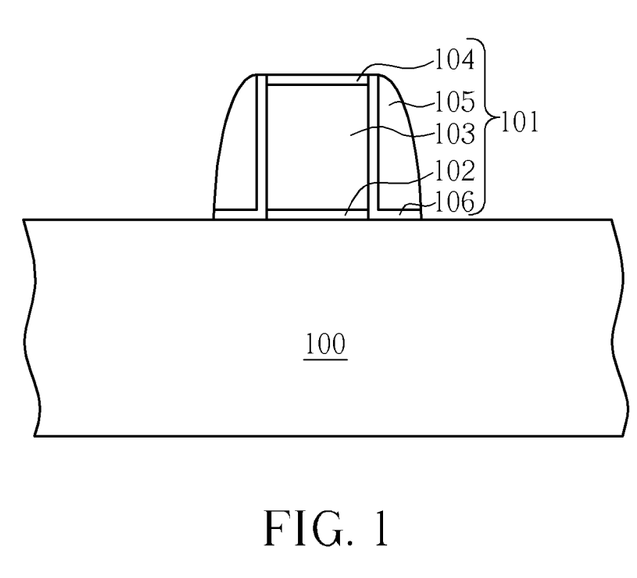
FIGS. 1-8 are cross-sectional views illustrating the process flow of a metal gate forming method in accordance with one preferred embodiment of the present invention.

First, please refer to FIGS. 1-8. Those figures illustrate sequentially the process flow for fabricating a metal gate. First, as shown in FIG. 1, a substrate 100 is provided as the base of the whole semiconductor structure. The substrate 100 may be, but not limited to, a silicon substrate, an epitaxial silicon substrate, a silicon germanium (SiGe) substrate, a silicon carbide (SiC) substrate, or a silicon-on-insulator (SOI) substrate, etc. The substrate 100 may be provided with predetermined NMOS regions and PMOS regions and corresponding P-wells and N-wells. A patterned gate structure 101 is formed on substrate 100, wherein the steps of forming gate structure 101 may comprise: forming sequentially a gate oxide layer (ex. $SiO_2$ and/or high-K material) 102, a dummy gate 103 (ex. poly-Si, SiN, SiON, or advanced pattern film (APF)), and a cap layer 104 (ex. SiN or $SiO_2$). Subsequently, using lithography and etching process to pattern cap layer 104, and then using patterned cap layer 104 as an etching hard mask to transfer the pattern of cap layer 104 to the gate oxide layer 102 and dummy gate 103. The forming methods of gate structure 101 are well-known in the art, and are not described herein for simplicity.

Refer again to FIG. 1, the dummy spacer 105 is formed on at least one of the surrounding sidewalls of the gate structure 101. The dummy spacer 105 is formed by depositing a material layer and then performing a dry etching process. In the present invention, the function of the dummy spacer 105 is to isolate the gate structure 101 from the epitaxial structure or the source/drain formed in subsequent processes. Also, the dummy spacer 105 has higher mechanical strength, which is better for the following replacement metal gate (RMG) process. The material of dummy spacer 105 may include SiN or advanced pattern film (APF) which is easy to be removed, so that the dummy spacer 105 can be easily replaced by a low-K spacer.

Furthermore, liner layers 106 are formed respectively at both sides of the gate structure 101 before forming the dummy spacer 105. The material of the liner layers 106 may include silicon carbonitride (SiCN), silicon oxynitride (SiON), and silicon nitride (SiN). The wet etching rates of those material are quite different from the etching rate of the dummy spacer 106 formed thereon, so that the liner layer 106 may serve as an etching stop layer during the step of removing the dummy spacer 105 because of their high etch selectivity. The presence of the liner layers 106 may further facilitate the adhering of the dummy spacer 105 on the gate structure 101 and substrate 100.

Figure 2:
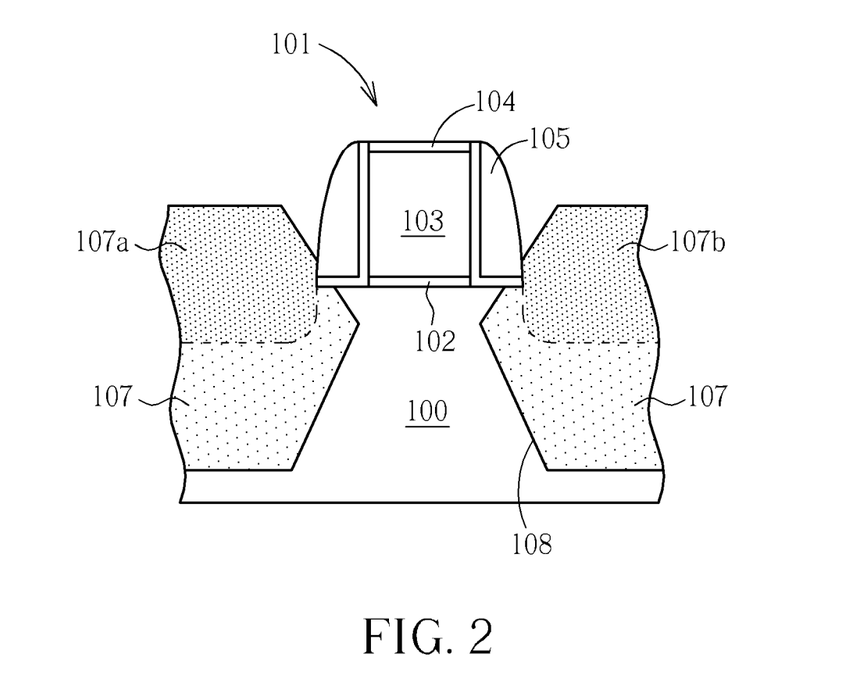

Please refer to FIG. 2, where epitaxial structures 107 are formed respectively at both sides of the gate structure 101. The epitaxial structures 107 are formed on the silicon surface at both sides of the gate structure 101 through an epitaxy process. The material of the epitaxial structures 107 may include silicon germanium (SiGe), silicon carbide (SiC), a combination thereof, or other III-V compounds, depending on the type of transistor (like PMOS or NMOS). The steps of forming epitaxial structure 107 may comprise: performing several dry etching processes and/or wet etching processes to form a recess 108 in the substrate 100 at both sides of the gate structure 101. Since the above etching process has dominant etching rate along specific crystallographic orientation of substrate material, the resulting recess 108 will have specific cross-sectional shape, such as the diamond shape shown in FIG. 2. Subsequently, perform a selective epitaxy growth (SEG) process to grow epitaxial structure 107 in the recess 108. Since the recess 108 has diamond cross-sectional shape and the epitaxial structure 107 will always grow along the surface of the substrate 100, the cross-sectional shape of resulting epitaxial structure 107 will also be diamond shape, whose top surfaces are higher than the surface of the substrate 100. The formed epitaxial structures 107 may exert a stress on the lattice of the substrate 100 under the gate structure 101 because of different lattice constant between epitaxial structures 107 and substrate 100 (usually Si Substrate), thereby forming a strained silicon channel, wherein electrons or holes mobility will be increased. In addition, the epitaxial structures 107 may include an un-doped epitaxial layer, a doped epitaxial bulk, and an un-doped epitaxial cap layer.

After forming the epitaxial structures 107, an ion implantation process is subsequently performed on the epitaxial structure 107 formed in the previous steps. This process may implant n-type dopants (ex. P, As, or Sb), p-type dopants (ex. B or $BF_2$) combined with other common dopants (ex. C, N, F, Ge, or Si) into the epitaxial structure 107 in corresponding NMOS or PMOS regions, thereby defining a source 107a and a drain 107b in the epitaxial structure 107 at both sides of the gate structure 101.

Optionally, a self-aligned Salicidation process may be performed to form a salicide layer (not shown) conformably on the surface of the epitaxial structures 107 for facilitating the electrical connection with the contact plug (not shown) formed in following process, wherein the salicide process may include a post clean process, a metal depositing process, an annealing process, or a selective etching process, etc. The forming process of the salicide layer is well-known in the art, thus no unnecessary detail is given herein for simplicity. Alternatively, the above-mentioned salicide process may be performed after the following replacement metal gate process, or after the formation of inter-layer dielectric (ILD) covering on source 107a and drain 107b, or after the formation of contact holes.

Figure 3:
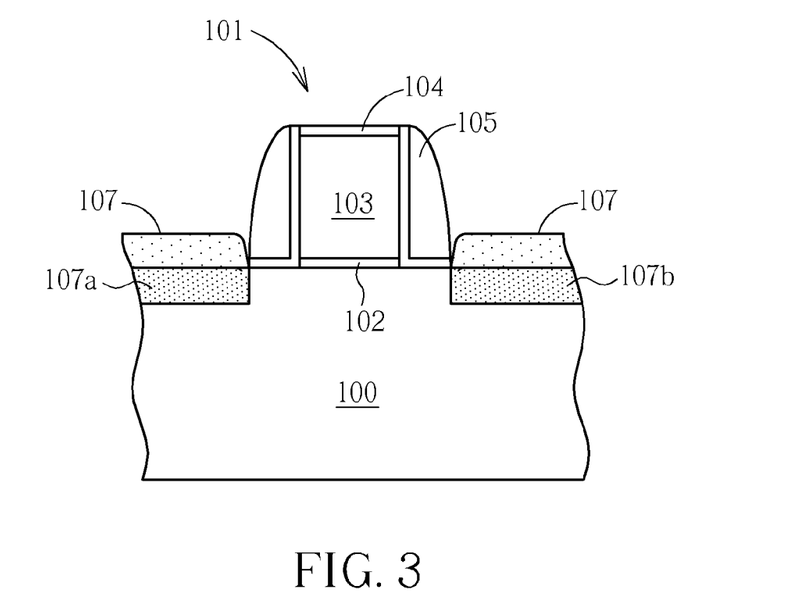

Alternatively, in another embodiment of present invention, epitaxial structure 107 may be formed directly on the source 107a and drain 107b in substrate 100, as the aspect of raised source/drain shown in FIG. 3, without forming the recess 108. In this embodiment, the epitaxial structure 107 is formed conformably on the surface of substrate 100, while the source 107a and drain 107b are defined in substrate 100 under the epitaxial structure 107.

Figure 4:
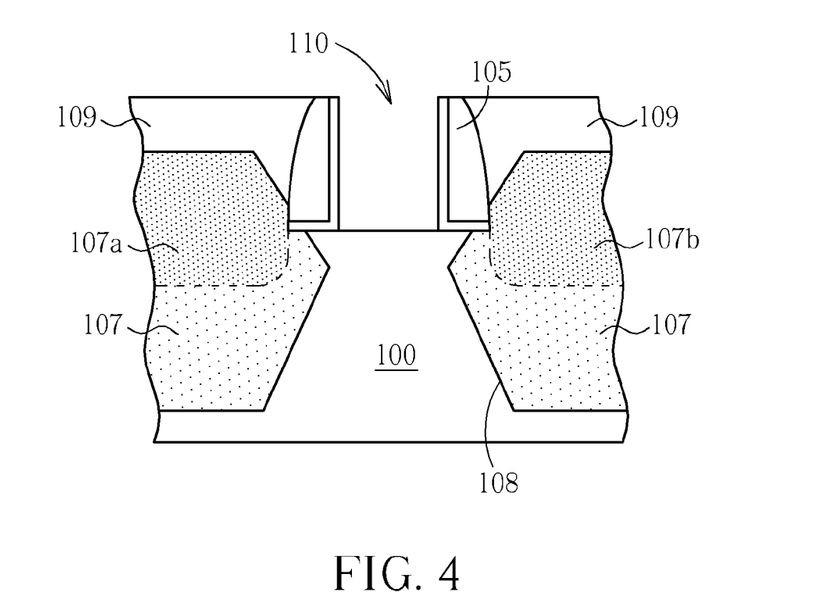

After defining the source 107a and drain 107b, please refer to FIGS. 2 and 4, a replacement metal gate (RMG) process is performed to replace the dummy gate 103 with metal gate. The replacement metal gate process is an advantageous process, which is able to avoid processes of high thermal budget due to the tempering treatment for activating the source/drain ultra-shallow junction and to provide wider material choices. The steps of replacement metal gate process in present invention may comprise: blanket-depositing a ILD layer 109 on entire substrate 100 (including entire gate structure 101 and epitaxial structure 107); removing parts of the ILD layer 109 and of the cap layer 104 by a planarization process to expose the dummy gate 103 in the gate structure 101; performing an etching process is to etch the exposed dummy gate 103. The dummy gate 103 and gate oxide layer 102 is then completely removed in this step to expose the substrate 100 thereunder. A gate trench 110 is formed in this process to provide a space for the metal gate material.

Figure 5:
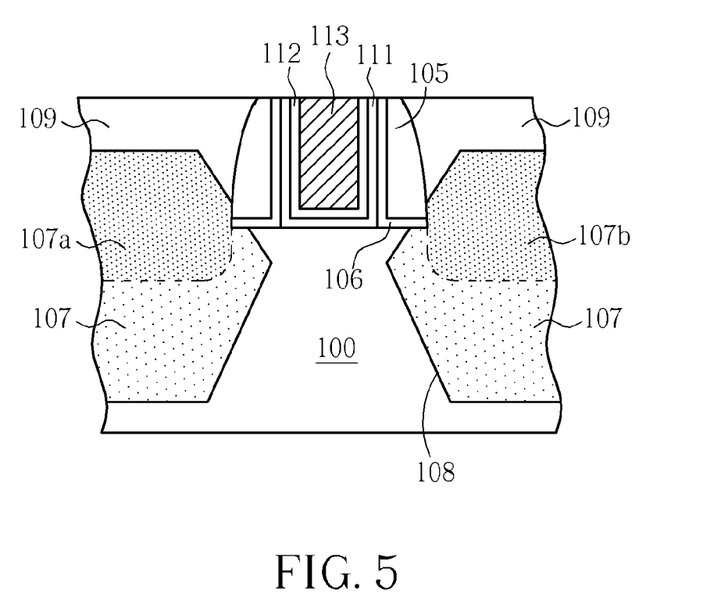

Please refer to FIG. 5, taken the high-K last process for example, a deposition process is performed first to form a gate dielectric layer 111 in the gate trench 110 after forming the gate trench 110. The gate dielectric layer 111 may includes high-K materials with dielectric constant larger than 4, such as rare earth metal oxides or lanthanide series metal oxides. The material may be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), andbariumstrontiumtitanate ($Ba_xSr_{1-x}TiO_3$, BST). The gate dielectric layer 111 may serve as the dielectric layer for the following metal gate structure.

On the other hand, for the high-K first process, the above-mentioned gate oxide layer 102 is formed by high-K material. This gate oxide layer 102 will not be removed in the following step of forming gate trench 110. The gate oxide layer 102 in this process may serve as the gate oxide layer in replacement metal gate process. It is unnecessary to form additional gate dielectric layer 111.

Subsequently, please refer again to FIG. 5, a chemical vapor deposition (CVD), a physical vapor deposition (PVD), or an atomic layer deposition (ALD) is performed to form a work function metal layer (WFM, 112) in the gate trench 110. The work function metal layer 112 may be a p-type work function metal layer and exemplarily includes titanium nitride (TiN), tantalum nitride (TaN), titanium carbide (TiC), tantalum carbide (TaC), tungsten carbide (WC), or aluminum titanium nitride (TiAlN), but not limited thereto. Alternatively, the work function metal layer 112 may be an n-type work function metal layer and exemplarily includes titanium aluminide (TiAl), zirconium aluminide (ZrAl), tungsten aluminide (WAl), tantalum aluminide (TaAl), or hafnium aluminide (HfAl), but not limited thereto. In addition, the work function metal layer 112 may be a single-layered structure or a multi-layered structure. For example, the work function metal layer 112 may comprises a plurality of different work function metal layers, to optimize the electrical properties of the gate device.

After the formation of work function metal layer 112, a top barrier layer (not shown) may be optionally formed in gate trench 110, and a filling metal layer 113 is then formed thereon. The filling metal layer 113 is formed to fill up the gate trench 110 and serves as the gate electrode. The filling metal layer 113 includes materials with low resistivity and superior gap-filling characteristics, such as Al, W, Cu, TiAl, or titanium aluminum oxide (TiAlO), but not limited thereto.

After forming the gate electrode above, one or more planarization process is finally performed, such as a CMP process, to remove the unnecessary filling metal layer 113, work function metal layer 112, and gate dielectric layer 109, thereby completing the fabrication of a replacement metal gate structure 116. Please note that the above-described replacement metal gate (RMG) process is only an exemplified embodiment, which briefly explain the basic steps for fabricating the various components in the replacement metal gate structure. Some repeating steps, or necessary components, may be omitted in this description without obscuring the principles of the RMG process combined with the semiconductor process of the present invention.

Figure 6:
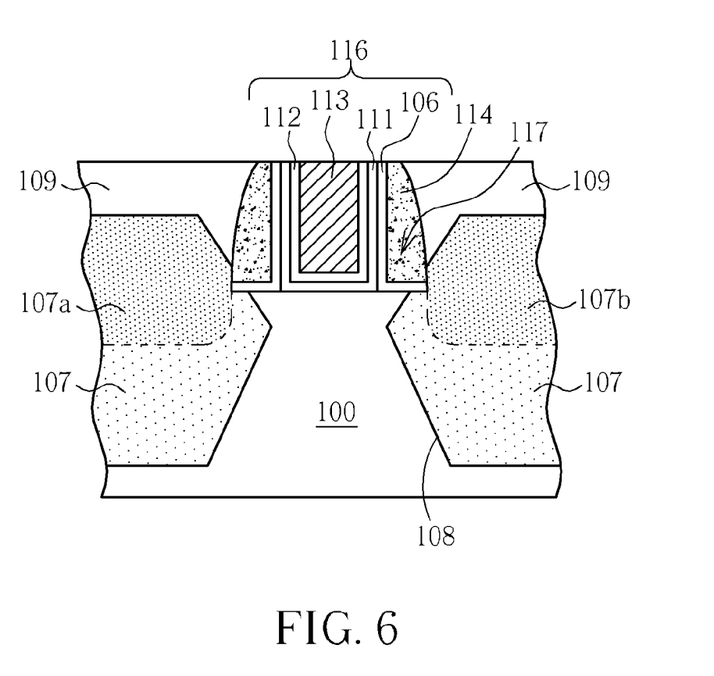

Subsequently, please refer to FIG. 5 and FIG. 6. After the fabrication of metal gate structure 116, a wet etching process is performed to remove the dummy spacer 105, so that a recess is formed between the ILD layer 109 and the liner layer 106. A low-K spacer 114 is then formed in said recess (especially the recess 117 between metal gate 116 and epitaxial structure 107) by spin-on-glass (SOG) process, for example, by introducing and curing the precursor, such as hydrogen polysilozane (with K value of approximately 3.5), methyl silsesquioxane (with K value of approximately 2.7), or organo aromatic polymer (with K value of approximately 2.6 to 2.9). Optionally, an ion implant process may be performed after removing the dummy spacer 105 and before forming low-K spacer 114 to form a lightly-doped drains (LDD, not shown) in the substrate 100 under the predetermined position of low-K spacer 114. The dopants may be n-type dopants such as phosphor (P) or arsenic (As) (for NMOS transistor), or p-type dopants such as boron (B) (for PMOS transistor).

The low-K spacer 114 in present invention may have different aspects. Please refer now to the FIG. 5 and FIG. 7, the ILD layer 109 may also be removed during the step of removing dummy spacer 105. This way, a recess 118 is formed between the entire metal gate structure 116 and epitaxial structure. The low-K spacer 114 will be formed respectively in the recesses 118, and the top surface of low-K spacer 114 will be lower than the top surface of metal gate structure 116. The bottom portion of the liner 106 is covered by the low-K spacer 114 that has a top surface leveled with the top surface of the epitaxial structure 107.

In other embodiment of present invention, the liner layer 106 of gate structure may be formed after completing the replacement metal gate process, rather than be formed before the forming of dummy space 105. Please refer to FIG. 5 and FIG. 8, in this embodiment, the liner layer 106 is not existed in FIG. 5. After removing the dummy spacer 105, a deposition process will be performed first to form a liner layer 106 in the recess between the metal gate structure 116 and ILD layer 109, and the low-K spacer 114 is formed subsequently in said recess, especially the recess 117 between the metal gate structure 116 and the epitaxial structure 107. In this way, the low-K spacer 114 will be surrounded by the liner layer 106. The material of liner layer 106 may include silicon carbonitride (SiCN), silicon oxynitride (SiON), and silicon nitride (SiN).

On the other hand, the replacement metal gate (RMG) process in present invention may also be performed after the formation of low-K spacer 114, depending on the mechanical strength of the low-K spacer 114. If the RMG process is performed after the formation of low-K spacer 114, the forming step of gate trench 110 in FIG. 4 will be pended. That is, the dummy spacer 105 will be replaced first with the low-K spacer 114, and the replacement process of metal gate is then performed.

Figure 7:
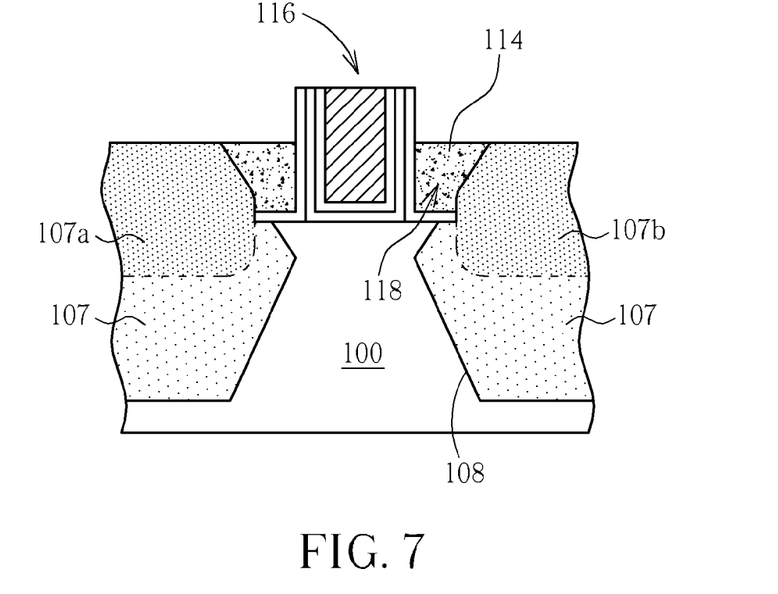
Figure 8:
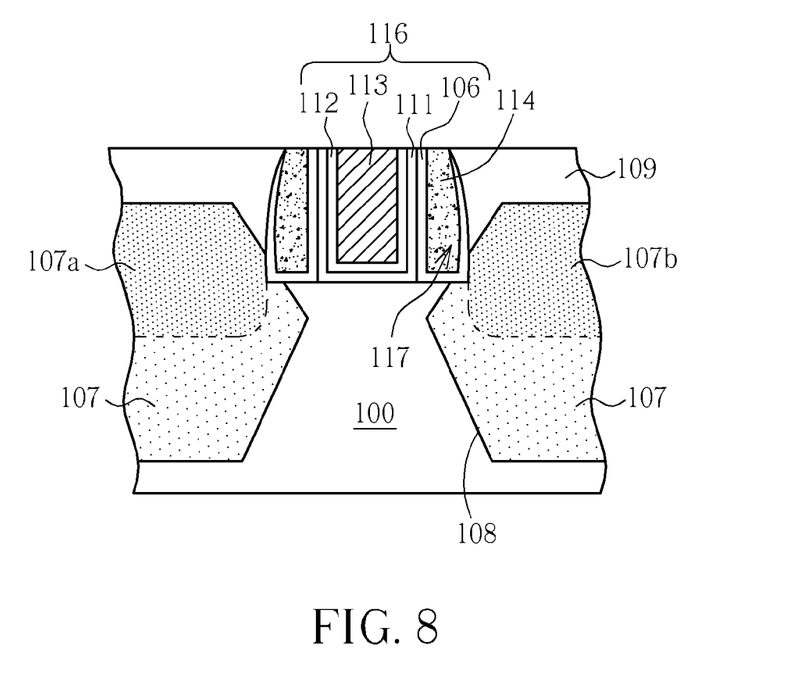

According to the above-mentioned process flow, a semiconductor structure with metal gate is provided in present invention, as shown in FIG. 7, comprising a substrate 100, a metal gate structure 116 on substrate 100, epitaxial structures 107 disposed respectively at both sides of the metal gate structure 116, and low-K spacers 114 disposed respectively in the recesses 118 between the metal gate structure 116 and the epitaxial structures 107, wherein the top surface of the low-K spacer 114 is lower than the top surface of the metal gate structure 116.

The above-mentioned process flow of present invention may also be applied to the fabrication of fin field effect transistor (Fin FET). In following embodiments, the process flow for Fin FET in present invention will be explained with reference to FIGS. 9-15.

Figure 9:
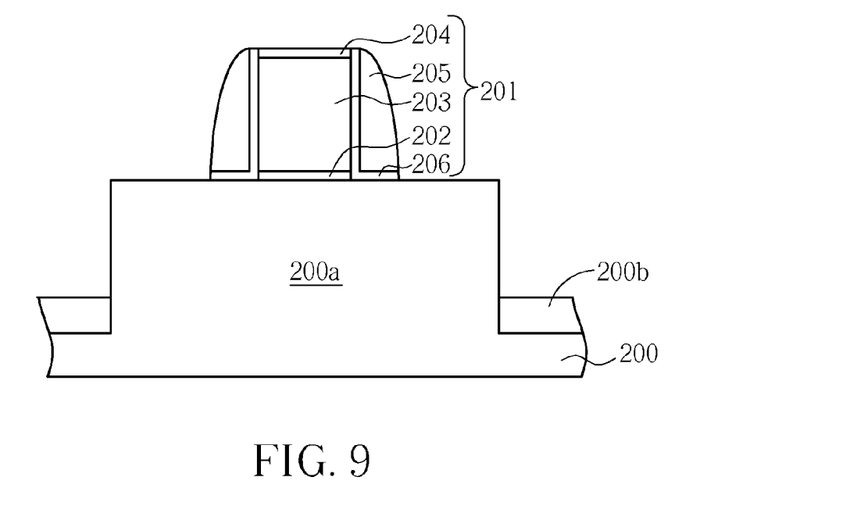
FIGS. 9-15 are cross-sectional views illustrating the process flow of a fin field effect transistor (Fin FET) forming method in accordance with another embodiment of present invention.
Figure 15:
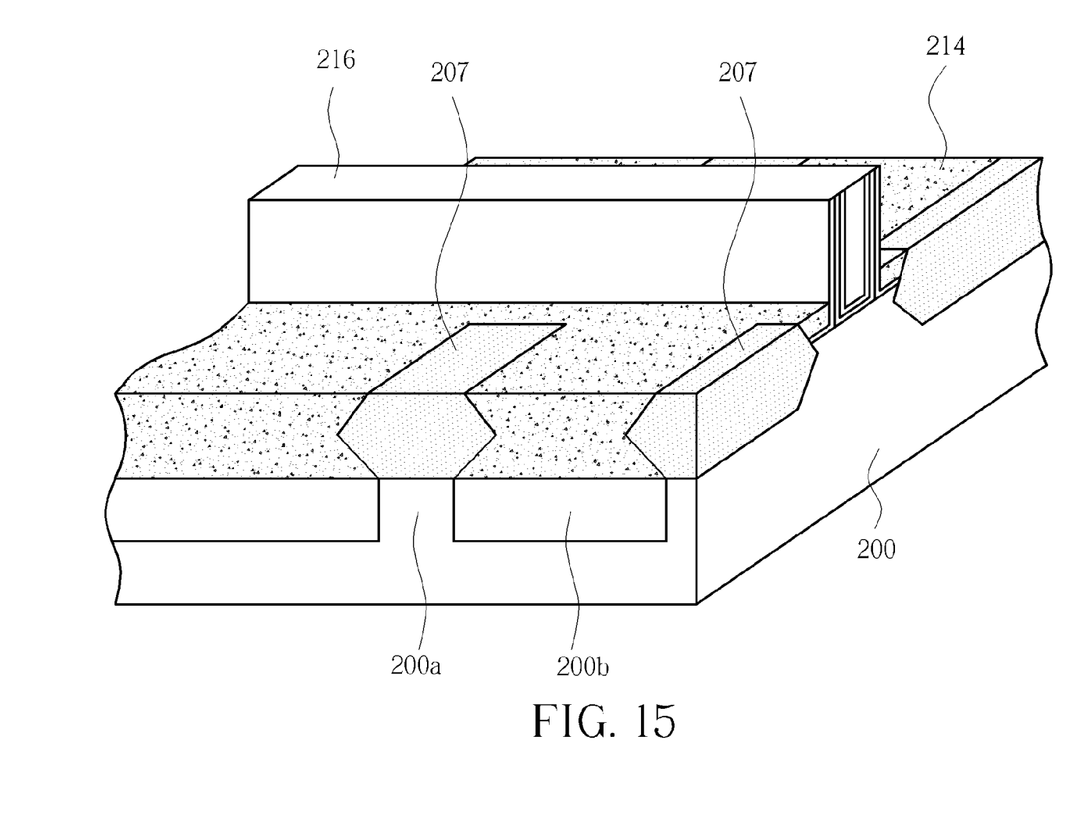

First, as shown in FIG. 9, a substrate 200 is provided as the base of the whole semiconductor structure. The substrate 200 may be, but not limited to, a silicon substrate, an epitaxial silicon substrate, a silicon germanium (SiGe) substrate, a silicon carbide (SiC) substrate, or a silicon-on-insulator (SOI) substrate, etc. The substrate 200 may be provided with predetermined NMOS regions and PMOS regions and corresponding P-wells and N-wells. A plurality of protruding fin structures 200a are formed on the substrate 200. The fin structure 200a may be formed by providing a patterned mask layer on the substrate 200 and then using said mask layer as an etch mask to perform an etching process on the substrate 200. After forming the fin structure 200a, an isolation structure 200b (ex. an oxide layer) is subsequently formed between each of the fin structures 200a by successively performing a deposition, a planarization, and an etch back process. As shown in FIG. 15, the isolation structure 200b may be formed between each fin structures 220a parallel to each other, thus good isolation may be provided for the devices formed in following process.

Subsequently, forming a patterned gate structure 201 on the fin structure 200a, wherein the gate structure 201 may comprise a gate oxide layer (ex. $SiO_2$ and/or high-K material) 202, a dummy gate 203 (ex. poly-Si, SiN, SiON, or advanced pattern film (APF)), and a cap layer (ex. SiN or $SiO_2$) 204. The forming methods of gate structure 201 are well-known in the art, and are not described herein for simplicity. As shown in FIG. 15, the gate structure 201 is formed traversing on part of the fin structures 200a and part of the substrate 200 in the direction perpendicular to the fin structures 200a, thereby forming a tri-gate FET structure or a fin FET structure.

Refer again to FIG. 9, the dummy spacer 205 is formed on at least one surrounding sidewalls of the gate structure 201. Dummy spacer 205 is formed by depositing a material layer and then performing a dry etching process to said material layer. In present invention, the function of dummy spacer 205 is to isolate the gate structure 201 from the epitaxial structure or source/drain formed in subsequent process. Also, the dummy spacer 205 has higher mechanical strength for accommodating to the following replacement metal gate (RMG) process. The material of dummy spacer 205 may include silicon nitride (SiN) or advanced pattern film (APF) which is easy to be removed, so that the dummy spacer 205 can be easily replaced with low-K spacer.

Furthermore, liner layers 206 may be formed respectively at both sides of the gate structure 201 before forming the dummy spacer 205. The material of liner layer 206 may include silicon carbonitride (SiCN), silicon oxynitride (SiON), and silicon nitride (SiN). The wet etching rates of those materials are quite different from the etching rate of the dummy spacer 206 formed thereon, thus the liner layer 206 may serve as an etching stop layer in the step of removing dummy spacer 205 because of their high etch selectivity. The presence of liner layer 206 may further facilitate the adhering of dummy spacer 205 on gate structure 201 and fin structure 200a.

Subsequently, please refer to FIG. 10, epitaxial structures 207 are formed respectively at both sides of the gate structure 201 after the formation of gate structure 201. Epitaxial structure 207 is formed on the silicon surface at both sides of the gate structure 201 by an epitaxy process. The material of the epitaxial structures 207 may include silicon germanium (SiGe), silicon carbide (SiC), a combination thereof, or other III-V compounds, depending on the type of transistor (such as PMOS or NMOS). The steps of forming gate structure 201 may comprises: performing several dry etching process and/or wet etching process to form a recess 208 in the fin structure 200a at both sides of the gate structure 201; performing a selective epitaxy growth (SEG) process to grow epitaxial structure 207 in the recess 208. Since the epitaxial structure 207 always grows along specific crystallographic orientation, the cross-sectional shape of epitaxial structure 207 is polygon, such as hexagon, whose top surface is higher than the surface of the fin structure 200a. The formed epitaxial structures 207 may exert a stress on the lattice of the fin structure 200a under the gate structure 201 because of different lattice constant between epitaxial structures 207 and fin structure 200a (usually made of Si material), thereby forming a strained silicon channel that may further increase the electrons or holes mobility.

After forming the epitaxial structures 207, an ion implantation process is subsequently performed on the epitaxial structure 207. This process may implant n-type dopants (ex. P, As, or Sb), p-type dopants (ex. B or $BF_2$) combining with other common dopants (ex. C, N, F, Ge, or Si) into the epitaxial structure 107 in corresponding NMOS regions or PMOS regions, thereby defining a source 207a and a drain 207b in the epitaxial structure 207 at both sides of the gate structure 201. A transistor structure is, therefore, completed.

Optionally, a self-aligned salicidation process may be performed to form a salicide layer (not shown) conformably on the surface of the epitaxial structures 207 for facilitating the electrical connection with the contact plug (not shown) formed in following process. The forming process of the salicide layer is well-known in the art, thus no unnecessary detail is given herein for simplicity. The above-mentioned salicidation process may also be performed after the replacement metal gate process, or after the formation of inter-layer dielectric (ILD) covering on source 207a and drain 207b, or after the formation of contact holes.

Figure 11:
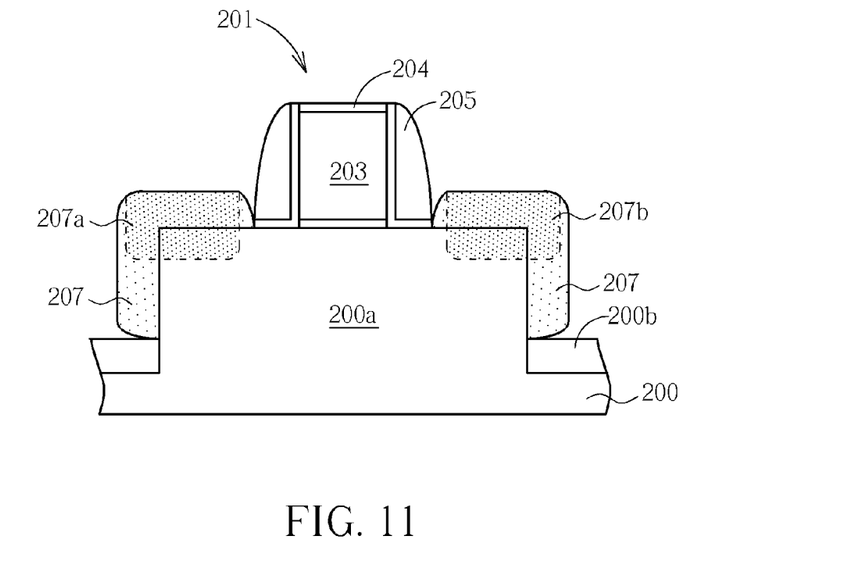

Alternatively, in another embodiment of present invention, epitaxial structure 207 may be formed directly on the fin structure 200a, as the aspect of raised source/drain shown in FIG. 11, without forming any recess 208. In this embodiment, the epitaxial structure 207 is formed conformably on the surface of fin structure 200a, while the source 207a and drain 207b are defined in part of the epitaxial structure 207 and part of the fin structure 200a.

Figure 10:
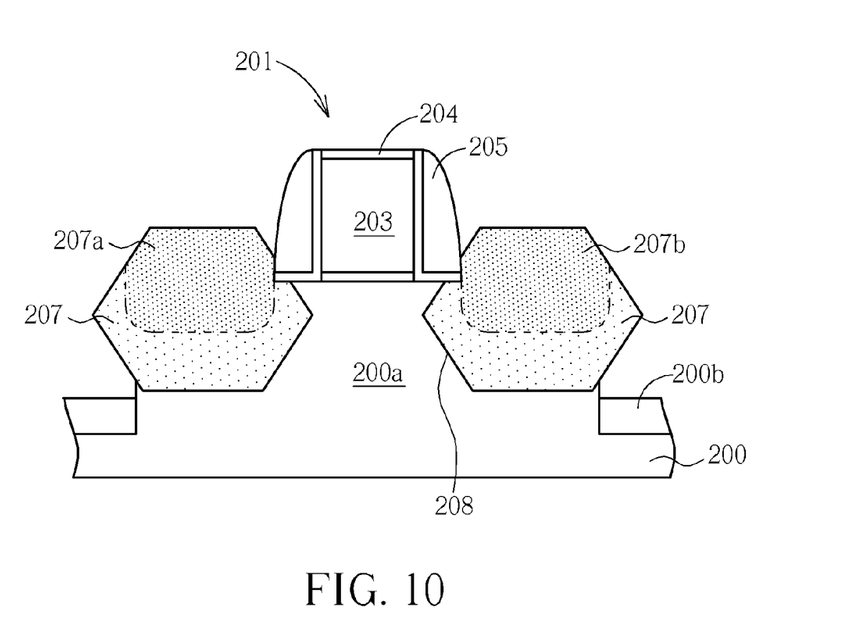
Figure 12:
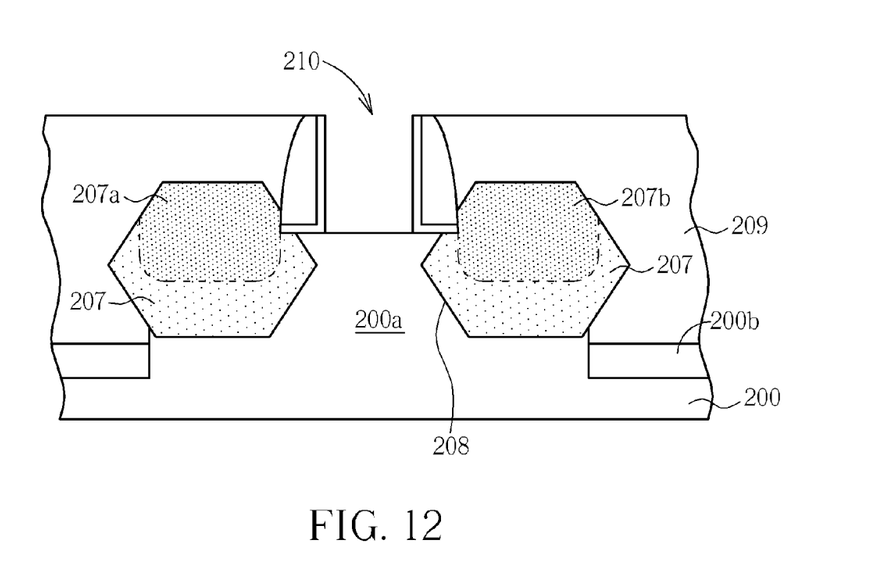

After defining the source 207a and drain 207b, please refer to FIGS. 10 and 12, a replacement metal gate (RMG) process is performed to replace the dummy gate 203 with a metal gate. The steps of replacement metal gate process in present invention may comprise: blanket-depositing an ILD layer 209 on entire substrate 200 (including gate structure 201, fin structures 200a, epitaxial structures 207, and isolation structure 200b); removing parts of the ILD layer 209 and of the cap layer 204 by a planarization process to expose the dummy gate 203 in the gate structure 201; performing an etching process to etch the exposed dummy gate 203. The dummy gate 203 and gate oxide layer 202 is then completely removed in this step to expose the surface of fin structures 200a thereunder. A gate trench 210 is formed in this process to provide a space for the metal gate material.

Figure 13:
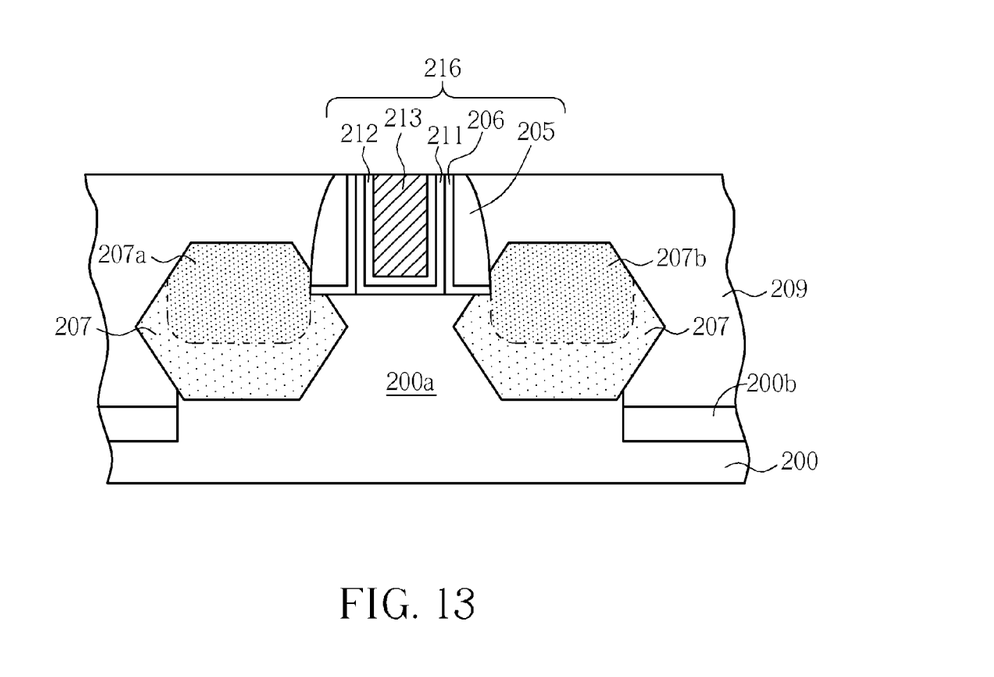

Please refer to FIG. 13, taken the high-K last process for example, a deposition process is performed first to form a gate dielectric layer 211 in the gate trench 210 after forming the gate trench 210. The gate dielectric layer 211 may includes high-K materials, such as rare earth metal oxides or lanthanide series metal oxides. The material may be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide (ZrSiO$_4$), hafnium zirconium oxide (HfZrO$_4$), strontium bismuth tantalate, (SrBi$_2$Ta$_2$O$_9$, SBT), lead zirconate titanate (PbZr$_x$Ti$_1$-xO$_3$, PZT), and barium strontium titanate (Ba$_x$Sr$_1$-xTiO$_3$, BST). The gate dielectric layer 211 may serve as the dielectric layer for the following metal gate structure. Please note that for the high-K first process, the above-mentioned gate oxide layer 202 is formed by high-K material. This gate oxide layer 202 will not be removed in the step of forming gate trench 210. The gate oxide layer 202 in this process may serve as a gate oxide layer for metal gate. It is unnecessary to form additional gate dielectric layer 211.

Subsequently, please refer again to FIG. 13, a chemical vapor deposition (CVD), a physical vapor deposition (PVD), or an atomic layer deposition (ALD) is performed to form a work function metal layer (WFM, 212) in the gate trench 210. The work function metal layer 212 may be a p-type work function metal layer and exemplarily includes titanium nitride (TiN), tantalum nitride (TaN), titanium carbide (TiC), tantalum carbide (TaC), tungsten carbide (WC), or aluminum titanium nitride (TiAlN), but not limited to this. Alternatively, the work function metal layer 212 may be an n-type work function metal layer and exemplarily includes titanium aluminide (TiAl), zirconium aluminide (ZrAl), tungsten aluminide (WAl), tantalum aluminide (TaAl), or hafnium aluminide (HfAl), but not limited to this. In addition, the work function metal layer 212 may be a single-layered structure or a multi-layered structure. For example, the work function metal layer 212 may comprises a plurality of different work function metal layers, to optimize the electrical properties of the gate device.

After the formation of work function metal layer 212, a top barrier layer (not shown) may be optionally formed in gate trench 210, and a filling metal layer 213 is then formed thereon. The filling metal layer 213 is formed to fill up the gate trench 210 and serves as the gate electrode. The filling metal layer 213 includes materials with low resistivity and superior gap-filling characteristics, such as Al, W, Cu, TiAl, or titanium aluminum oxide (TiAlO), but not limited thereto.

After forming the gate electrode above, one or more planarization process is finally performed, such as a CMP process, to remove the unnecessary filling metal layer 213, work function metal layer 212, and gate dielectric layer 211 formed on the ILD layer 209, thereby completing the fabrication of a metal gate structure 216. Please note that the above-described replacement metal gate (RMG) process is only an exemplified embodiment, which briefly explain the basic steps for fabricating the various components in the replacement metal gate structure. Some repeating steps, or necessary components, may be omitted in this description without obscuring the principles of the RMG process combined with the semiconductor process of the present invention.

Similarly, an ion implant process may be performed to form lightly doped drains (LDD, not shown) in the fin structure 200a under the spacers 205. The dopants may be n-type dopants such as phosphor (P) or arsenic (As) (for NMOS transistor), or p-type dopants such as boron (B) (for PMOS transistor).

Figure 14:
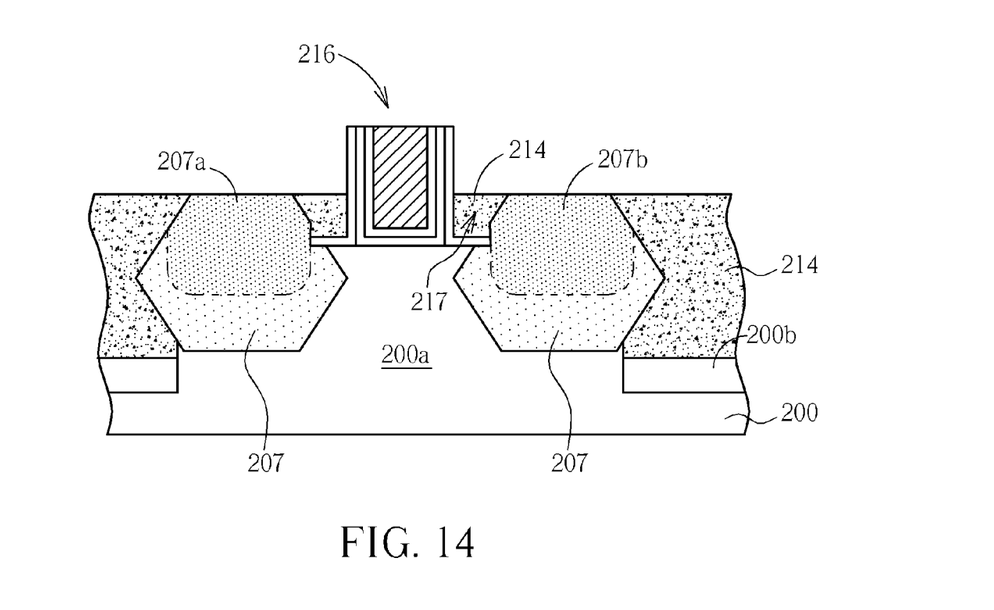

Subsequently, please refer to FIG. 13 and FIG. 14. After the fabrication of metal gate structure 116, a wet etching process is performed to remove the dummy spacer 205 and ILD layer 209, thereby exposing the metal gate structure 216, the epitaxial structures 207, and the isolation structure 200b. A low-K material layer (not shown) is then formed on entire substrate (including the region of metal gate structure 216, epitaxial structure 207, and isolation structure 200b) by spin-on-glass (SOG) process, for example, by introducing and curing the precursor, such as hydrogen polysilozane (with K value of approximately 3.5), methyl silsesquioxane (with K value of approximately 2.7), or organo aromatic polymer (with K value of approximately 2.6 to 2.9). After forming said low-K material layer, an etch back process is performed to reduce the thickness of the deposited low-K material layer to a predetermined value. The low-K spacer 214 is, therefore, formed. More specifically, as shown in FIG. 14 and FIG. 15, the low-K spacer 214 formed in present embodiment fill up the recess 217 between the gate structure 216 and epitaxial structure 207 and the spaces between each fin structures 200a. Furthermore, the surface of the low-K spacer 214 is leveled with the top surface of the epitaxial structure 207 or is lower than the top surface of the metal gate structure 216.

On the other hand, the replacement metal gate (RMG) process in present invention may also be performed after the formation of low-K spacer 214, depending on the mechanical strength of the low-K spacer 214. If the RMG process is performed after the formation of low-K spacer 214, the forming step of gate trench 210 in FIG. 12 will be pended. In this process flow, the replacement process of metal gate will be performed after removal of the dummy spacer 205 and ILD layer 209 and the formation of the low-K material layer.

According to the above-mentioned process flow, as shown in FIG. 14, a fin field effect transistor (Fin FET) is provided in present invention comprising: a substrate 200; at least one fin structure 200a formed on substrate 200; a gate 216 formed on fin structure 200a; epitaxial structures 207 formed respectively in fin structure 200a at both sides of the gate 216; and low-K spacers 214 formed respectively in the recesses 217 between gate 216 and epitaxial structures 207 and in the recesses surrounding or between the fin structures 200a, wherein the top surface of low-K spacer 214 is leveled with the top surface of epitaxial structure 207 and is lower than the top surface of the gate 216, but higher than the top surface of the fin structure 200a.

For present invention, it is possible to form a spacer with low-K material by using spin-on-glass (SOG) process. The parasite capacitance may be efficiently reduced by forming the spacer structure with such low-K material. Moreover, the recess between the gate structure and the epitaxial structures may be filled completely with the spacer in this process due to its excellent gap-filling capacity.

Figure 16:
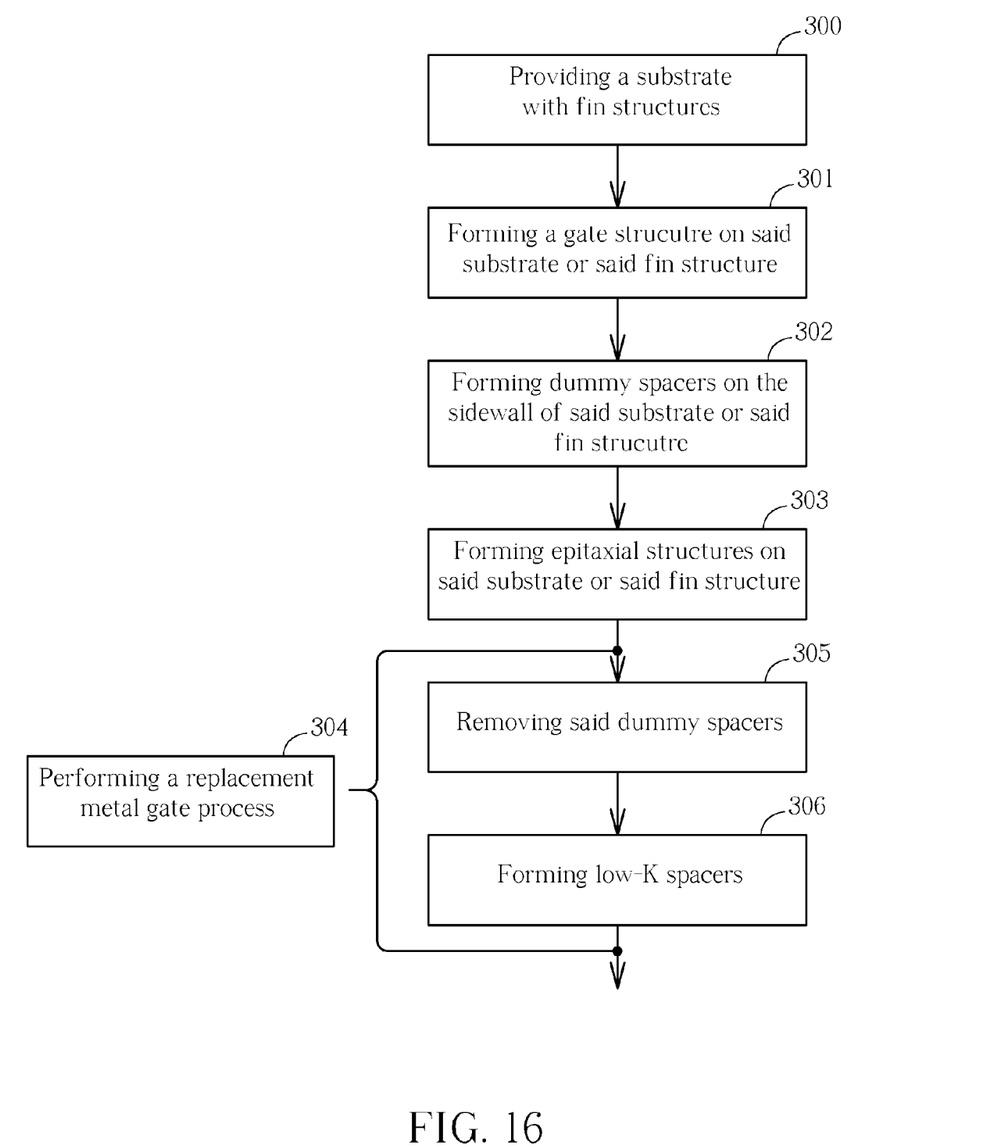
FIG. 16 is a process flow of present invention.

To sum up the processes and all technical features provided in the above embodiments of the present invention, a process flow of present invention is provided in FIG. 16 comprising the steps of: providing a substrate or a substrate with fin structures (step 300), forming a gate structure on said substrate or said substrate with fin structures (step 301), forming dummy spacers on the sidewalls of said substrate (step 302), forming epitaxial structures on said substrate or on said fin structures (step 303), performing a replacement metal gate process (step 304), removing said dummy spacers (step 305), and forming low-K spacers (step 306), wherein the replacement metal gate process (step 304) may also be performed after the formation of the low-K spacers (step 306).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fin field effect transistor (Fin FET), comprising:
 a substrate;
 at least one fin structure formed on said substrate;
 a gate formed on said at least one fin structure;
 epitaxial structures formed respectively in said at least one fin structure at both sides of said gate; and low-K spacers, a portion of the low-k spacers filling up at least one recess between said gate and said epitaxial structures and another portion of the low-k spacers filling up at least one recess surrounding said at least one fin structure, wherein a top surface of the portion of the low-k spacers filling up the at least one recess between said gate and said epitaxial structures and a top surface of the another portion of said low-K spacers filling up the at least one recess surrounding said at least one fin structure are leveled with a top surface of said epitaxial structures, higher than a top surface of the at least one fin structure, and lower than a top surface of the gate.

2. The fin field effect transistor according to claim 1, further comprising a liner layer formed between said gate and said epitaxial structures.

3. The fin field effect transistor according to claim 2, wherein a material of said liner layer comprises silicon carbonitride (SiCN), silicon oxynitride (SiON), or silicon nitride (SiN).

4. The fin field effect transistor according to claim 1, wherein said epitaxial structures comprise at least one source and at least one drain.

5. The fin field effect transistor according to claim 1, wherein a material of said epitaxial structures comprises Si—Ge epitaxy or Si—C epitaxy.

6. The fin field effect transistor according to claim 1, wherein said gate comprises a poly-Si gate or a metal gate.

* * * * *